United States Patent [19]

Ishac et al.

[11] Patent Number: 5,438,546

[45] Date of Patent: Aug. 1, 1995

[54] PROGRAMMABLE REDUNDANCY SCHEME SUITABLE FOR SINGLE-BIT STATE AND MULTIBIT STATE NONVOLATILE MEMORIES

[75] Inventors: Michel I. Ishac, Citrus Heights; Sanjay S. Talreja, Folsom; Mark E. Bauer, Cameron Park, all of Calif.

[73] Assignee: Intel Corporation, Santa Clara, Calif.

[21] Appl. No.: 252,682

[22] Filed: Jun. 2, 1994

[51] Int. Cl.[6] .............................................. G11C 7/00
[52] U.S. Cl. ..................................... 365/200; 365/49; 365/189.02; 365/189.07
[58] Field of Search ................. 365/200, 49, 189.02, 365/230.02, 230.06, 230.03, 189.07; 371/10.3

[56] References Cited

U.S. PATENT DOCUMENTS

| | | | |
|---|---|---|---|
| 4,376,300 | 3/1983 | Tsang | 365/200 |
| 4,601,019 | 7/1986 | Shah et al. | 365/200 |
| 4,807,191 | 2/1989 | Flannagan | 365/200 X |
| 5,031,142 | 7/1991 | Castro | 365/49 |
| 5,065,364 | 11/1991 | Atwood et al. | 365/185 |
| 5,083,294 | 1/1992 | Okajima | 365/200 |
| 5,233,559 | 8/1993 | Brennan, Jr. | 365/200 |
| 5,327,383 | 7/1994 | Merchant et al. | 365/200 X |
| 5,347,484 | 9/1994 | Kwong et al. | 365/49 |

OTHER PUBLICATIONS

B. F. Fitzgerald et al., "Memory System with High-Performance Word Redundancy," IBM Technical Disclosure Bulletin, vol. 19, No. 5, pp. 1638–1639 (Oct. 1976).

*Primary Examiner*—Joseph A. Popek
*Attorney, Agent, or Firm*—Blakely, Sokoloff, Taylor & Zafman

[57] ABSTRACT

A nonvolatile memory includes a first and a second output, a main array having a first and a second column, and a redundant array having a first and a second redundant column. A logic includes a first and a second CAM set. The first CAM set activates the first redundant column to replace the first column if defective. The second CAM set activates the second redundant column to replace the second column if it is defective. A configuration circuit is provided for controlling the logic to selectively couple the first and second columns and the first and second redundant columns to the first and second outputs. When the configuration circuit is in a first state, the logic couples the first redundant column to the first output if it is activated and the second redundant column to the second output if it is activated. When the configuration circuit is in a second state, the logic couples (1) the first redundant column to the first and second outputs when the first column is defective and addressed, (2) the second column to the first and second outputs when the second column is addressed and the first column is defective, or (3) the second redundant column to the first and second outputs when the second column is addressed and defective.

15 Claims, 6 Drawing Sheets

| MATCH0 | MATCH1 | MLS0 | MLS1 | ODD/EVEN | N_MATCH0 | N_MATCH1 | I/O SEL0,1 FOR MUX$_i$ | I/O SEL0,1 FOR MUX$_{i+1}$ | N-I/O SEL0,1 FOR MUX$_i$ | N-I/O SEL0,1 FOR MUX$_{i+1}$ | D$_i$ | D$_{i+1}$ | REMARKS |
|---|---|---|---|---|---|---|---|---|---|---|---|---|---|
| 0 | 0 | 0 | 0 | x | 0 | 0 | 00 | 00 | 00 | 00 | SAi | SAi+1 | SINGLE BIT CELL |
| 0 | 1 | 0 | 0 | x | 0 | 0 | 00 | 01 | 00 | 01 | SAi | RSA1 | |
| 0 | 1 | 0 | 0 | x | 0 | 1 | 01 | 00 | 01 | 00 | RSA1 | SAi+1 | |
| 1 | 0 | 0 | 0 | x | 1 | 0 | 00 | 10 | 00 | 10 | SAi | RSA0 | |
| 1 | 0 | 0 | 0 | x | 0 | 0 | 10 | 00 | 10 | 00 | RSA0 | SAi+1 | |
| 1 | 1 | 0 | 0 | x | 1 | 1 | 01 / 10 | 10 / 01 | 01 / 10 | 10 / 01 | RSA1 or RSA0 | RSA0 or RSA1 | |
| 0 | 0 | 1 | 0 | 0 | 0 | 0 | 00 | 00 | 00 | 00 | SAi | SAi+1 | NO REPLACEMENT |
| 0 | 1 | 1 | 0 | 0 | 0 | 1 | 00 | 00 | 00 | 00 | SAi | SAi+1 | REPLACE ODD COL. BUT READ EVEN COL. |
| 1 | 0 | 1 | 0 | 0 | 1 | 0 | 10 | 00 | 10 | 00 | RSA0 | SAi+1 | REPLACE EVEN COL. AND READ EVEN COL. |
| 1 | 1 | 1 | 0 | 0 | 1 | 1 | 1X | 0X | 10 | 00 | RSA0 | SAi+1 | REPLACE BOTH AND READ EVEN COL. |
| 0 | 0 | 0 | 1 | 1 | 0 | 0 | 00 | 00 | 00 | 00 | SAi | SAi+1 | NO REPLACEMENT |
| 0 | 1 | 0 | 1 | 1 | 0 | 1 | 00 | 01 | 00 | 01 | SAi | RSA1 | REPLACE ODD COL. AND READ ODD COL. |
| 1 | 0 | 0 | 1 | 1 | 1 | 0 | 00 | 00 | 00 | 00 | SAi | SAi+1 | REPLACE EVEN COL. BUT READ ODD COL. |
| 1 | 1 | 0 | 1 | 1 | 1 | 1 | X0 | X1 | 10 | 01 | RSA0 | RSA1 | REPLACE BOTH AND READ ODD COL. |

X = DO NOT CARE
I = 0, 2, 4, 6, 8, 10, 12, or 14

*Figure 6*

PROGRAMMABLE REDUNDANCY SCHEME SUITABLE FOR SINGLE-BIT STATE AND MULTIBIT STATE NONVOLATILE MEMORIES

FIELD OF THE INVENTION

The present invention pertains to the field of computer memories. More particularly, this invention relates to a programmable redundancy scheme for a nonvolatile memory that may include either single-bit state memory cells or multibit state memory cells.

BACKGROUND OF THE INVENTION

A prior art flash erasable and electrically programmable read-only memory ("flash EPROM") includes memory cells that individually can be programmed with a single bit of data. The data stored in a selected memory cell of the prior art flash EPROM can be read by a sense amplifier. The data stored in the memory cells of the prior art flash EPROM can be electrically erased once programmed.

The prior art flash EPROM typically includes redundant memory cells and CAM cells in addition to a main memory array. The redundant memory cells are used to replace defective cells of the main memory array. The CAM cells are typically used to activate the redundant columns to replace any defective columns of the main memory array. The CAM cells typically comprise flash EPROM cells and are typically arranged into groups in order to be programmed to store addresses of the defective memory columns of the main memory array. The grouped CAM cells are therefore referred to as CAM banks or CAM sets.

A typical prior an arrangement of using the redundant memory columns and the CAM banks to replace defective columns in the main memory array employs a number of the CAM banks, each associated with one redundant column. When a defective column in the main memory array is discovered, the address of the defective column is stored in a CAM bank. A comparison with the stored address is made every time the flash EPROM is addressed to determine whether a cell in the defective column is addressed. If so, the redundant column associated with the CAM bank is activated for the read, programming, or erasure operation of the defective column. If not, the redundant column associated with the CAM bank is not activated.

Advances in technology have led to of multibit state flash EPROMs. For multibit state flash EPROMs, each memory cell stores multiple bits of data. This is done by storing more than two logic levels, typically four or more levels. During a read operation, a number of sense amplifiers are required for each memory cell selected for the read operation. For example, a two-bit state flash EPROM typically requires two sense amplifiers to read the data stored in a selected memory cell. This typically causes the redundancy scheme for a single-bit state flash EPROM to be different from a multibit state flash EPROM.

Typically, for a single-bit state flash EPROM, only one redundant sense amplifier is connected to an activated redundant column. For a multibit state flash EPROM, however, a number of redundant sense amplifiers equal to that of sense amplifiers for a selected column in the main memory array are required for an activated redundant column. Thus, the redundancy scheme for a single-bit state flash EPROM is different from that of a multibit state flash EPROM.

SUMMARY AND OBJECTS OF THE INVENTION

One of the objects of the present invention is to provide a redundancy scheme suitable for either a single bit state memory or a multibit state memory.

Another object of the present invention is to provide a reconfigurable redundancy scheme that can be programmed for a memory with single-bit state cells or a memory with multibit state cells.

Another object of the present invention is to provide a memory the redundancy scheme of which can be determined after the memory is fabricated.

A memory is described that includes a first output and a second output. The nonvolatile memory also includes a main array having a first column and a second column and a redundant array having a first redundant column and a second redundant column. A logic is provided in the memory that includes a first CAM set and a second CAM set. The first CAM set activates the first redundant column to replace the first column when the first column is defective. The second CAM set activates the second redundant column to replace the second column when the second column is defective. A configuration circuit is provided in the nonvolatile memory for controlling the logic to selectively couple the first and second columns and the first and second redundant columns to the first and second outputs. When the configuration circuit is in a first state, the logic couples the first column or the first redundant column to the first output and the second column or the second redundant column to the second output under control of the first and second CAM sets. When the configuration circuit is in a second state, the logic couples (1) the first redundant column to the first and second outputs when the first column is defective and addressed, (2) the second column to the first and second outputs when the second column is addressed and the first column is defective, or the second redundant column to the first and second outputs when the second column is addressed and defective.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements, and in which:

FIG. 6 is a truth table showing the relation of various signals illustrated in FIGS. 2-5.

DETAILED DESCRIPTION

Figure 1:
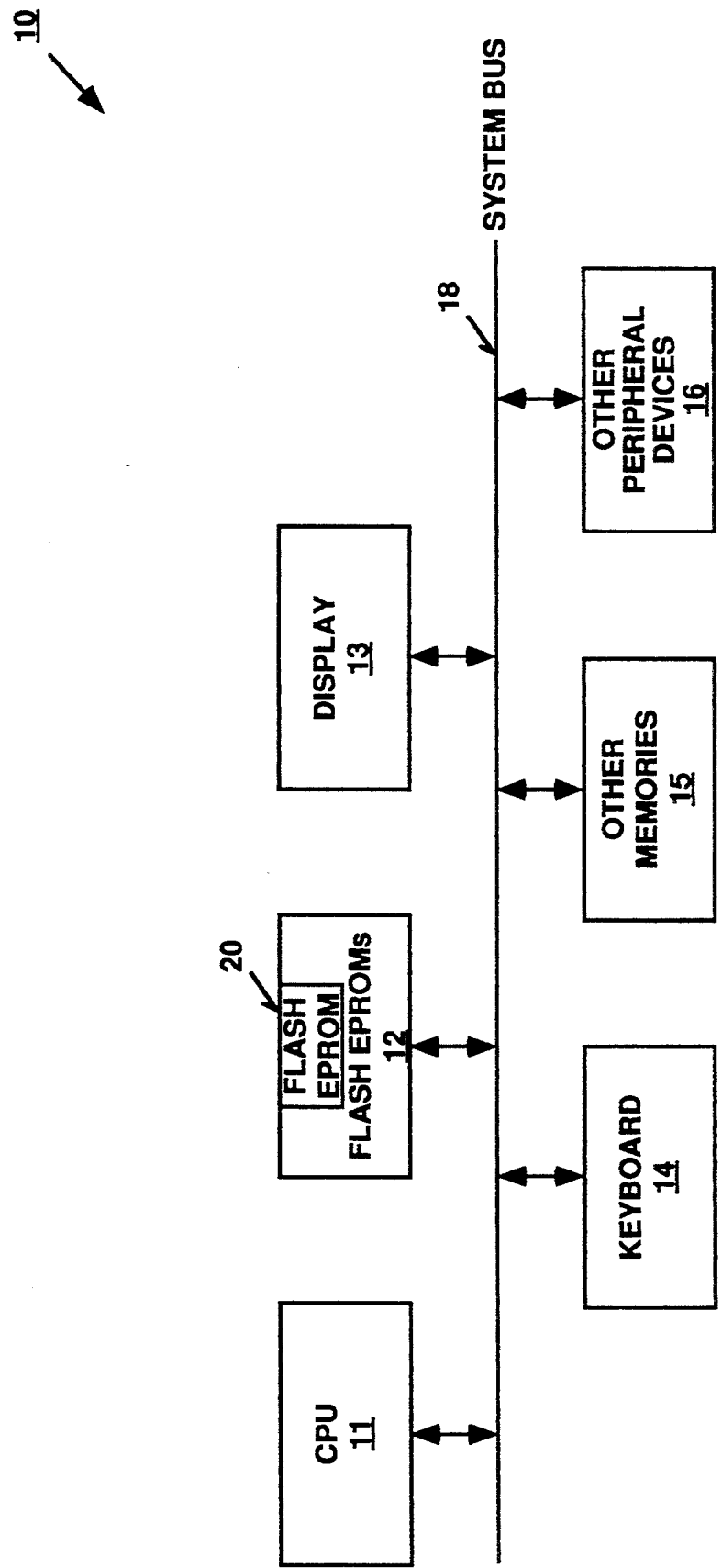
FIG. 1 is a block diagram of a computer system that includes a CPU and a flash EPROM.

FIG. 1 illustrates the architecture of a computer system 10 that includes a flash EPROM 20 that implements an embodiment of the present invention. Computer system 10 includes a bus 18 connected to a central processing unit ("CPU") 11, flash EPROMs 12, a display 13, a keyboard 14, and other memories 15. Flash EPROMs 12 include flash EPROM 20. Flash EPROM 20 can be replaced with other type of memory. For example, flash EPROM 20 can be replaced with a read-only memory ("ROM"), a random access memory ("RAM"), or an EPROM. Bus 18 is also connected to other peripheral devices 16. These other peripheral devices may include a modem, a serial communication controller, a local area network ("LAN"), and a parallel communication controller.

Figure 2:
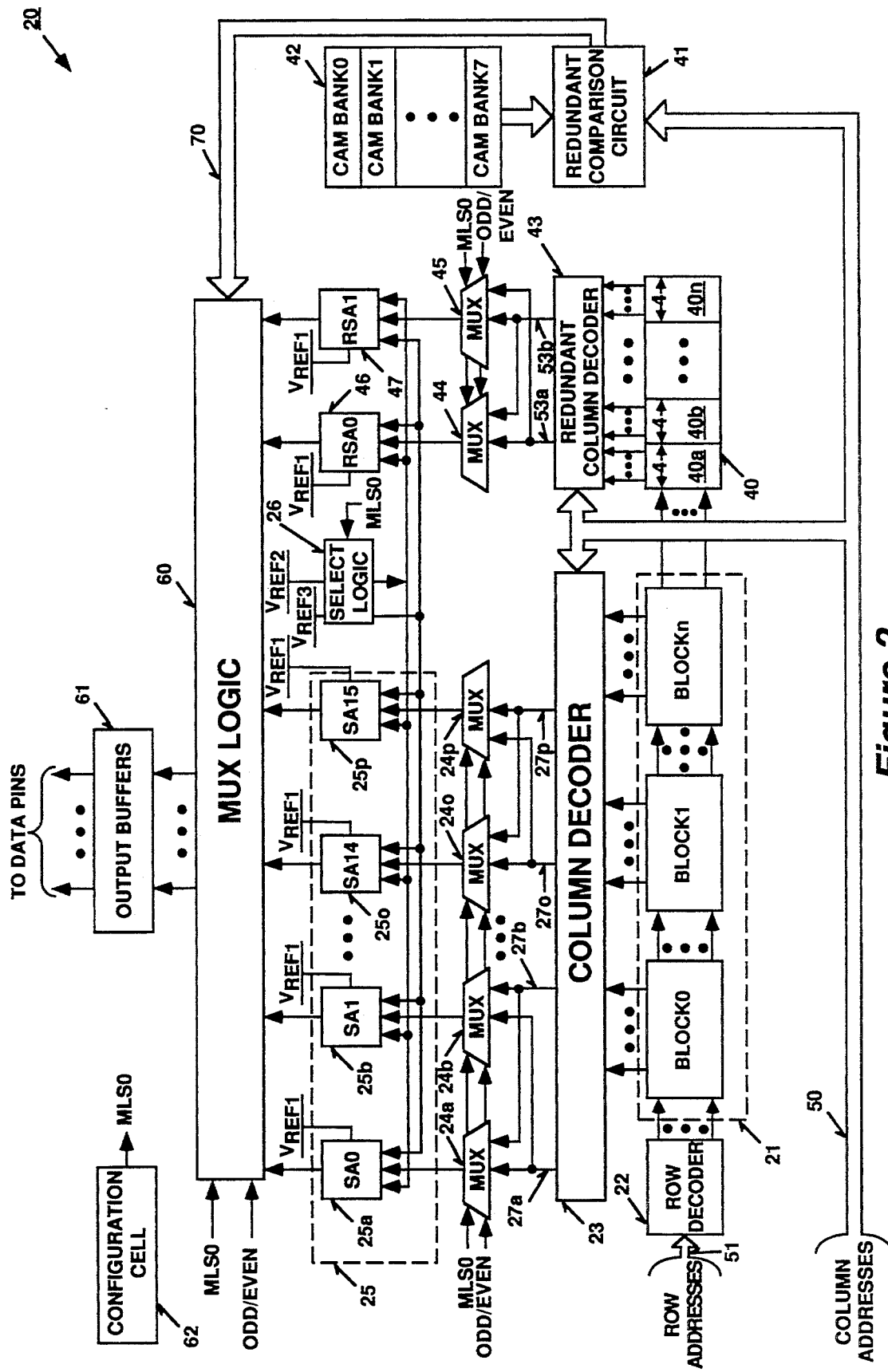
FIG. 2 is a block diagram of the flash EPROM of FIG. 1 that implements one embodiment of the present invention, wherein the flash EPROM includes redundant column decoder, CAM banks, comparison logic, configuration cells, multiplexer logic, and multiplexers.

FIG. 2 illustrates the circuitry of flash EPROM 20. Flash EPROM 20 includes a memory array 21 that is made up of flash EPROM cells that store data at addresses. For one embodiment, memory array 21 stores 16 Mbits ("megabits") of data. For alternative embodiments, memory array 21 can be smaller or larger than 16 Mbits.

For one embodiment as shown in FIG. 2, flash EPROM 20 can be configured as a single-bit state flash EPROM or a two-bit state flash EPROM. When flash EPROM 20 is configured as a single-bit state flash EPROM, each of the memory cells in memory array 21 can store a single bit of data. When flash EPROM 20 is configured as a two-bit state flash EPROM, each of the memory cells in memory array 21 can store two bits of data. Alternatively, flash EPROM 20 can also be configured with more than two bits of data stored in each of memory cells. For one embodiment, all the circuitry of flash EPROM 20 shown in FIG. 2 resides on a single substrate and employs CMOS circuitry.

Memory array 21 includes a number of blocks BLOCK0 through BLOCKn. Blocks BLOCK0 through BLOCKn are grouped into bit line blocks. Each block includes a plurality of bit lines (i.e., columns). The columns from each of blocks BLOCK0-BLOCKn are selectively coupled to main sense amplifiers 25 via a column decoder 23 and multiplexers 24a through 24p. Column decoder 23 includes a plurality of column select transistors coupled to the columns from blocks BLOCK0-BLOCKn. Column decoder 23 supplies bit lines $27a$-$27p$. Bit lines $27a$-$27p$ include even bit lines that are coupled to the even selected columns and odd bit lines that are coupled to the odd selected columns. For example, bit line $27a$ is an even bit line and bit line $27b$ is an odd bit line. Column decoder 23 couples the selected columns from blocks BLOCK0-BLOCKn to bit lines $27a$-$27p$. Bit lines $27a$-$27p$ are then connected to main sense amplifiers 25 via multiplexers 24a-24p during read operation. The outputs of main sense amplifiers 25 are then coupled to output buffers 61 via a multiplexer logic 60. Sense amplifiers 25 include a number of sense amplifiers 25a through 25p. Output buffers 61 include a number of output buffers.

For one embodiment as shown in FIG. 2, flash EPROM 20 includes sixteen data pins $D_0$ through $D_{15}$. For this embodiment, sense amplifiers 25 include sixteen sense amplifiers and output buffers 61 include sixteen buffers, each corresponding to one of data pins $D_0$-$D_{15}$.

Flash EPROM 20 includes a row decoder 22. Row decoder 22 is coupled to word lines of memory array 21 and selects one word line in accordance with each of the row addresses applied via bus 51 in a read or programming operation.

Column decoder 23 receives column addresses from address bus 50. For one embodiment as shown in FIG. 2, column decoder 23 selects one word of columns (i.e., 16 lines) within a block to undergo read or programming operation for every column address applied. Column decoder 23 connects the selected columns in the selected block to bit lines $27a$-$27p$ for every column address applied.

Multiplexers $24a$-$24p$ selectively couple bit lines $27a$-$27p$ to sense amplifiers $25a$-$25p$. As can be seen from FIG. 2, each of multiplexers 24a through 24p is connected to two adjacent bit lines of bit lines $27a$ through $27p$. Two adjacent multiplexers of multiplexers $24a$-$24p$ receive the same two bit lines of bit lines $27a$-$27p$. For example, multiplexer 24a is connected to bit lines $27a$ and $27b$ and multiplexer 24b is also connected to bit lines $27a$ and $27b$. Multiplexers 24a and 24b form a pair. Multiplexer 24a selectively connects one of bit lines $27a$ and $27b$ from column decoder 23 to sense amplifier 25a. Multiplexer 24b selectively connects one of bit lines $27a$ and $27b$ from column decoder 23 to sense amplifier 25b. Each of multiplexers $24a$-$24p$ is controlled by a MLS0 signal and an ODD/EVEN signal for the selection.

The MLS0 signal is a configuration signal that controls each pair of multiplexers $24a$-$24p$ to connect either the same bit line to their respective sense amplifiers or different bit lines to their respective sense amplifiers. For example, when the MLS0 signal is in a logical high state, both multiplexers $24a$-$24b$ connect either bit line $27a$ or bit line $27b$ to the respective sense amplifiers $25a$-$25b$. When the MLS0 signal is in a logical low state, multiplexer 24a connects bit line $27a$ to its sense amplifier 25a and multiplexer 24b connects bit line $27b$ to its sense amplifier 25b. The ODD/EVEN signal causes each pair of multiplexers to select one of the two bit lines when the MLS0 signal is logically high. The ODD/EVEN signal is an address signal when flash EPROM 20 is a two-bit state flash EPROM. The MLS0 and ODD/EVEN signals will be described in more detail below.

Each of sense amplifiers 25a through 25p receives a reference voltage VREF1. In addition, a reference voltage VREF2 and a reference voltage VREF3 are also applied to each of sense amplifiers $25a$-$25p$ via a select logic 26. Select logic 26 selectively applies the VREF2 and VREF3 voltages to each of sense amplifiers $25a$-$25p$. The MLS0 signal controls select logic 26 to apply the VREF2 and VREF3 voltages. For one embodiment, the VREF2 voltage is higher than the VREF1 voltage. The VREF3 voltage is lower than the VREF1 voltage. When select logic 26 does not apply the VREF2 and VREF3 voltages to each of sense amplifiers $25a$-$25p$, each of sense amplifiers $25a$-$25p$ acts as a single-bit state sense amplifier. When select logic 26 applies the VREF2 and VREF3 voltages to sense amplifiers $25a$-$25p$, each of sense amplifiers $25a$-$25p$ acts as a two-bit state sense amplifier. This allows flash EPROM 20 to be configured as either a single-bit state flash EPROM or a two-bit state flash EPROM.

Flash EPROM 20 also includes a configuration cell 62. Configuration cell 62 is a flash EPROM cell. Configuration cell 62 generates the MLS0 signal. Configuration cell 62 configures flash EPROM 20 either as a single-bit state flash EPROM or a two-bit state flash EPROM. For one embodiment, when configuration cell 62 is not programmed (i.e., in the erased state), it generates the logical low MLS0 signal that configures flash EPROM 20 as a single-bit state flash EPROM. When configuration cell 62 is programmed, it generates the logical high MLS0 signal that configures flash EPROM 20 as a two-bit state flash EPROM.

When flash EPROM 20 is configured as a single-bit state flash EPROM, the logical low MLS0 signal controls each of multiplexes 24a-24p to connect each of bit lines 27a-27p to its respective one of sense amplifiers 25a-25p. For example, multiplexer 24b connects bit line 27b to sense amplifier 25b and multiplexer 24o connects bit line 27o to sense amplifier 25o. The ODD/EVEN signal is not valid and is blocked by the logical low MLS0 signal. Meanwhile, the logical low MLS0 signal controls select logic 26 not to connect the VREF2 and VREF3 voltages to sense amplifiers 25a-25p each of sense amplifiers 25a-25p only receives the VREF1 voltage.

When flash EPROM 20 is configured as a two-bit state flash EPROM, the MLS0 signal controls multiplexers 24a-24p to connect either the even ones of bit lines 27a-27p or the odd ones of bit lines 27a-27p to sense amplifiers 25a-25p. When this occurs, each of the selected half of bit lines 27a-27p is connected to two of sense amplifiers 25a-25p via the respective pair of multiplexers of multiplexers 24a-24p. For example, multiplexers 24a and 24b connect either bit line 27a or bit line 27b to sense amplifiers 25a and 25b. The ODD/EVEN signal determines whether the even ones or the odd ones of bit lines 27a-27p are connected to the respective sense amplifiers 25a-25p via the respective multiplexers 24a-24p.

Flash EPROM 20 also includes a redundant memory array 40. Redundant array 40 is organized into redundant blocks 40a through 40n, each being associated with one of blocks BLOCK0 through BLOCKn of memory array 21. Redundant memory array 40 is coupled to a redundant column decoder 43. For one embodiment, each of redundant blocks 40a-40n includes four redundant columns of memory cells (i.e., four redundant bit lines).

Figure 3:
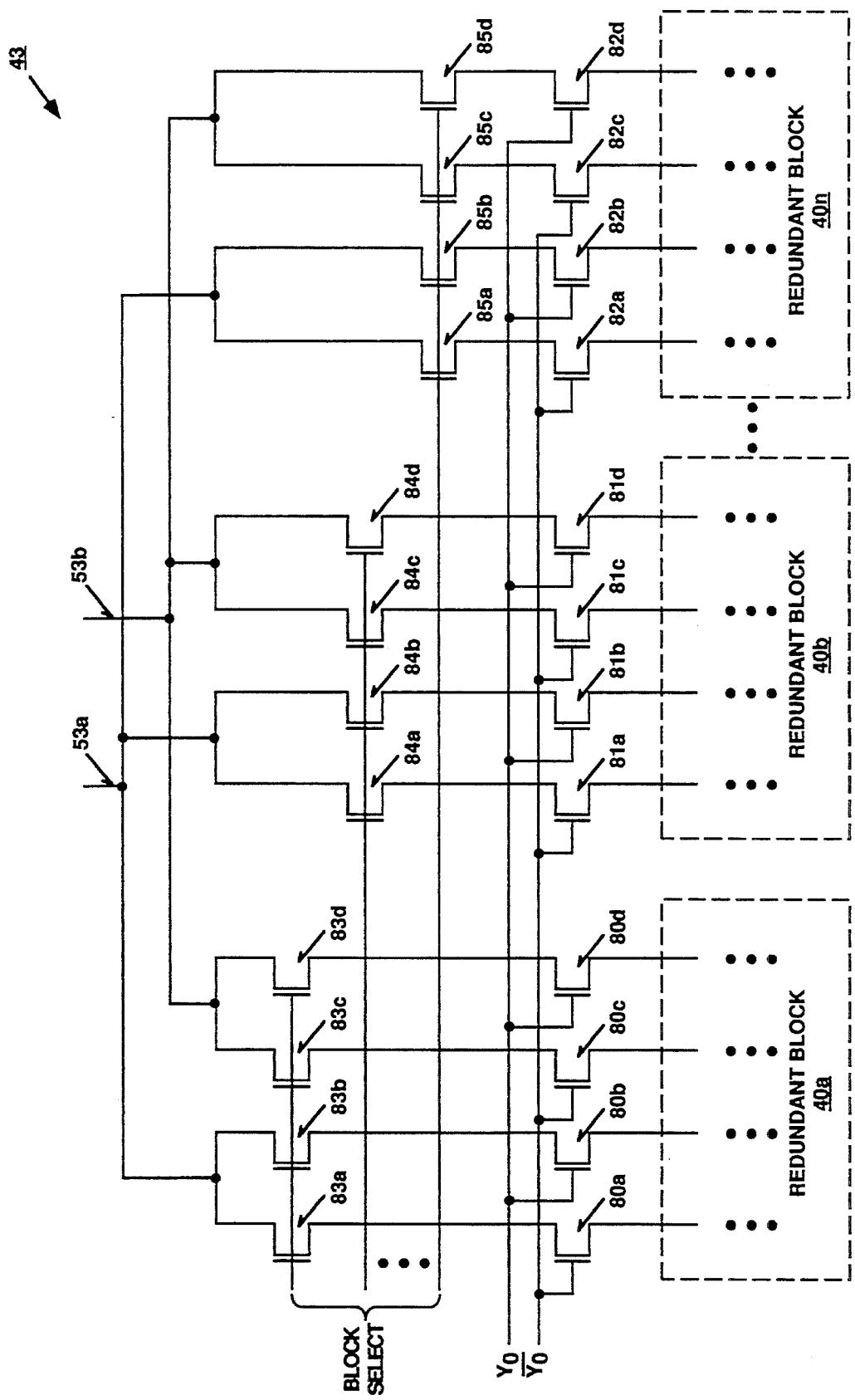
FIG. 3 is a block diagram of the redundant column decoder for the redundant blocks of FIG. 2.

For one embodiment, redundant memory array 40 is not a physical memory array and the redundant columns in each of redundant blocks 40a-40n reside in the associated one of blocks BLOCK0-BLOCKn. In other words, each of blocks BLOCK0-BLOCKn of memory array 21 includes four extra columns of memory cells. These extra columns serve as the redundant columns for the block. For this embodiment, redundant column decoder 43 is embodied in column decoder 23. FIG. 3 schematically shows the circuitry of redundant column decoder 43, which will be described in more detail below.

Referring to FIG. 3, redundant column decoder 43 includes block select transistors 83a-83d, 84a-84d, through 85a-85d and column select transistors 80a-80d, 81 a-81d, through 82a-82d. Block select transistors 83a-83d are used to select redundant block 40a. Block select transistors 84a-84d are used to select redundant block 40b and block select transistors 85a-85d are used to select redundant block 40n. Block select transistors 83a-83d, 84a-84d, through 85a-85d receive block addresses from bus 50 (FIG. 2).

The column select transistors for each redundant block are used to select redundant columns within the redundant block. The column transistors receive the least significant column address bit $Y_0$ and its complementary signal $\overline{Y_0}$. For example, transistors 80a and 80c receive the $\overline{Y_0}$ signal and transistors 80b and 80d receive the $Y_0$ signal. Therefore, for every address applied to bus 50, two redundant columns in each of redundant blocks 40a-40n are selected, one coupled to redundant bit line 53a and one coupled to redundant bit line 53b. Alternatively, other column address bits can be used to select the redundant column within a redundant block. The block select transistors determine which one of redundant block can have its redundant columns coupled to redundant bit lines 53a and 53b. The column select transistors within the selected redundant block determines which two redundant columns are coupled to redundant bit lines 53a-53b.

Referring to FIGS. 2-3, the redundant columns in each of redundant blocks 40a-40n can replace defective columns in the associative one of blocks BLOCK0-BLOCKn. For example, when redundant block 40a is associated with main block BLOCK0, each of the redundant columns in redundant block 40a can replace one defective column found in BLOCK0. When replacing a defective column in main memory array 21, the redundant column is accessed whenever the respective defective column is accessed.

Figure 5:
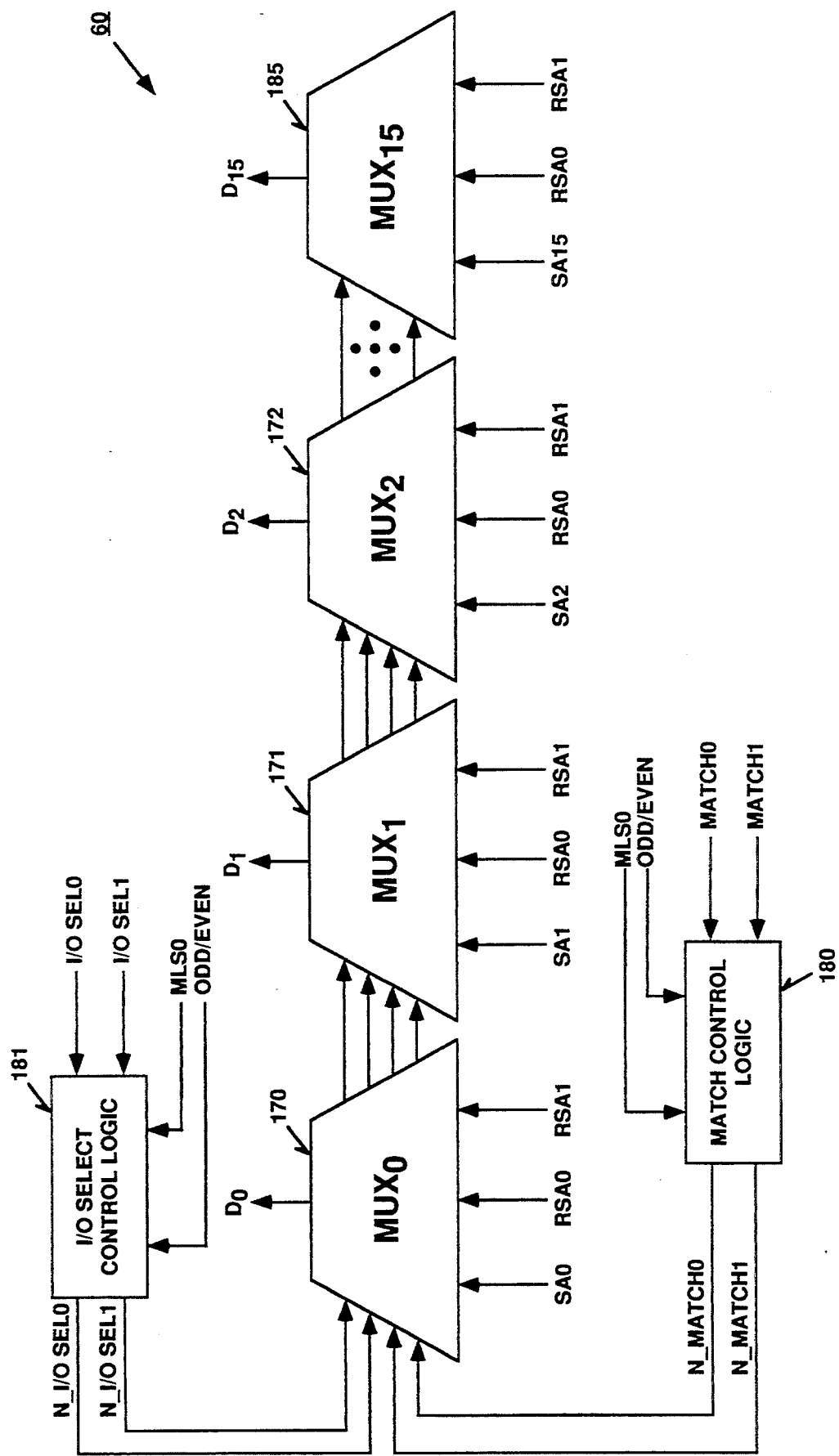
FIG. 5 is a block diagram of the multiplexer logic of FIG. 2.

Referring to FIG. 2, flash EPROM 20 also includes redundant sense amplifiers 46 and 47. The redundant columns of each of redundant block 40a-40n are selectively coupled to redundant sense amplifiers 46 and 47 via redundant column decoder 43 and multiplexers 44 and 45. The outputs of redundant sense amplifiers 46 and 47 are used to replace the outputs of the sense amplifiers that are coupled to defective columns. Thus, the outputs of redundant sense amplifiers 46 and 47 are multiplexed in multiplexer logic 60 with the outputs of main sense amplifiers 25. The resulting outputs from multiplexer logic 60 are coupled to output buffers 61. FIG. 5 shows the circuitry of multiplexer logic 60, which will be described in more detail below.

Because flash EPROM 20 includes two redundant sense amplifiers 46 and 47, redundant column decoder 43 can select up to two redundant columns within a redundant block to replace two defective columns for every column address applied. When flash EPROM 20 includes more than two redundant sense amplifiers, more than two redundant columns within a redundant block can be selected to replace more than two defective columns for every column address applied. As can be seen from FIG. 2, redundant bit line 53a is connected to redundant sense amplifier 46 via multiplexer 44 and to redundant sense amplifier 47 via multiplexer 45. Likewise, redundant bit line 53b is connected to redundant sense amplifier 46 via multiplexer 44 and to redundant sense amplifier 47 via multiplexer 45. Multiplexers 44 and 45 selectively connect bit lines 53a and 53b to sense amplifiers 46 and 47 under control of the MLS0 and ODD/EVEN signals.

When flash EPROM 20 is configured as a single-bit state flash EPROM, each of bit lines 27a-27p is connected to one of sense amplifiers 25a-25p via one of multiplexers 24a-24p during a read operation. When this occurs, each of the selected redundant columns for a column address is also connected to an associative one of redundant sense amplifiers 46 and 47. The MLS0 signal controls multiplexer 44 to connect redundant bit line 53a to sense amplifier 46 and multiplexer 45 to connect redundant bit line 53b to sense amplifier 47.

When a column of the selected columns from the selected block of memory array 21 is found defective, a redundant column in the corresponding redundant block is activated to replace the defective column and the output of one of redundant sense amplifiers 46 and 47 is used to replace the output of the respective sense amplifier of main sense amplifiers 25 that is coupled to the defective column. Multiplexer logic 60 determines which one of the outputs of redundant sense amplifiers 46 and 47 is used to replace the output from the defective column of main memory array 21, which will be described in more detail below.

When flash EPROM 20 is configured as a two-bit state flash EPROM, two of multiplexers 24a–24p connect the same bit line to their respective sense amplifiers under control of the MLS0 signal. When this occurs, two of sense amplifiers 25a–25p are connected to a selected bit line via the respective multiplexers 24a–24p. Only half of bit lines 27a–27p are connected to sense amplifiers 25a–25p. In addition, multiplexers 44 and 45 connect either redundant bit line 53a or redundant bit line 53b to redundant sense amplifiers 46 and 47 under control of the MLS0 signal. This is different from the coupling of sense amplifiers 25a–25p and redundant sense amplifiers 46 and 47 when flash EPROM 20 is configured as a single-bit state flash EPROM. For example, when bit line 27a is coupled to a defective column of the selected columns and a redundant column coupled to redundant bit line 53a is selected to replace the defective column, the outputs of sense amplifiers 25a and 25b are not replaced by that of redundant sense amplifiers 46 and 47 when the ODD/EVEN signal controls multiplexers 24a and 24b to connect bit line 27b instead of bit line 27a to sense amplifiers 25a and 25b. When the ODD/EVEN signal controls multiplexers 24a and 24b to connect bit line 27a to sense amplifiers 25a and 25b, the redundant bit line 53a is then connected to redundant sense amplifiers 46 and 47 via multiplexers 44 and 45 under control of the ODD/EVEN signal. When this occurs, the outputs of redundant sense amplifiers 46 and 47 are used to replace that of sense amplifiers 25a and 25b, respectively. This redundancy scheme will be described in more detail below, also in conjunction with FIGS. 3–6.

As can be seen from FIG. 2, multiplexer logic 60 receives control signals from redundant comparison circuit 41 via bus 70 and the MLS0 and ODD/EVEN signals. Multiplexer logic 60 selectively applies the outputs of sense amplifiers 25a–25p and the outputs of redundant sense amplifiers 46 and 47 to output buffers 61. Multiplexer logic 60 selectively applies, for example, sixteen outputs from sense amplifiers 25a–25p and redundant sense amplifiers 46 and 47 to output buffers 61 for every column address applied. The selection of multiplexer logic 60 is controlled by the control signals from redundant comparison circuit 41 via bus 70 and the MLS0 and ODD/EVEN signals.

Each of redundant sense amplifiers 46 and 47 receives the VREF1 voltage. In addition, the VREF2 and VREF3 voltages are also applied to redundant sense amplifiers 46 and 47 via select logic 26. Similar to each of sense amplifiers 25a–25p, each of redundant sense amplifiers 46–47 acts as a single-bit state sense amplifier when the MLS0 signal does not control select logic 26 to apply the VREF2 and VREF3 voltages to redundant sense amplifiers 46–47. When the MLS0 signal controls select logic 26 to apply the VREF2 and VREF3 voltages to redundant sense amplifiers 46–47, each of redundant sense amplifiers 46–47 acts as a two-bit state sense amplifier and can sense a data bit from a two-bit state.

For one embodiment as shown in FIG. 2, flash EPROM 20 also includes CAM banks or CAM sets 42 connected to comparison circuit 41. CAM banks 42, for example, can include eight banks or sets of CAM cells, each CAM bank acts as a storage register to store data.

Each of CAM banks 42 can activate a redundant column in one of redundant blocks 40a–40n to replace a defective column in main memory array 21 via multiplexer logic 60 and comparison circuit 41. For one embodiment, CAM banks 0 through 3 are grouped together to generate a MATCH0 signal and CAM banks 4–7 are grouped together to generate a MATCH1 signal. When the incoming address matches the address stored in one of CAM banks 0–3, the MATCH0 signal is asserted. When the incoming address matches the address stored in one of CAM banks 4–7, the MATCH1 signal is asserted. When flash EPROM 20 is configured as a single-bit state flash EPROM, each of CAM banks 0–7 can activate a redundant column to replace any defective column in main memory array 21. When flash EPROM 20 is configured as a two-bit state flash EPROM, each of CAM banks 0–3 can cause a selected redundant column connected to even bit line 53a to replace an even selected defective column and each of CAM banks 4–7 can cause a selected redundant column connected to odd bit line 53b to replace an odd selected defective column. The structure of CAM banks 42 and comparison circuit 41 will be described in more detail below, in conjunction with FIG. 4.

Figure 4:
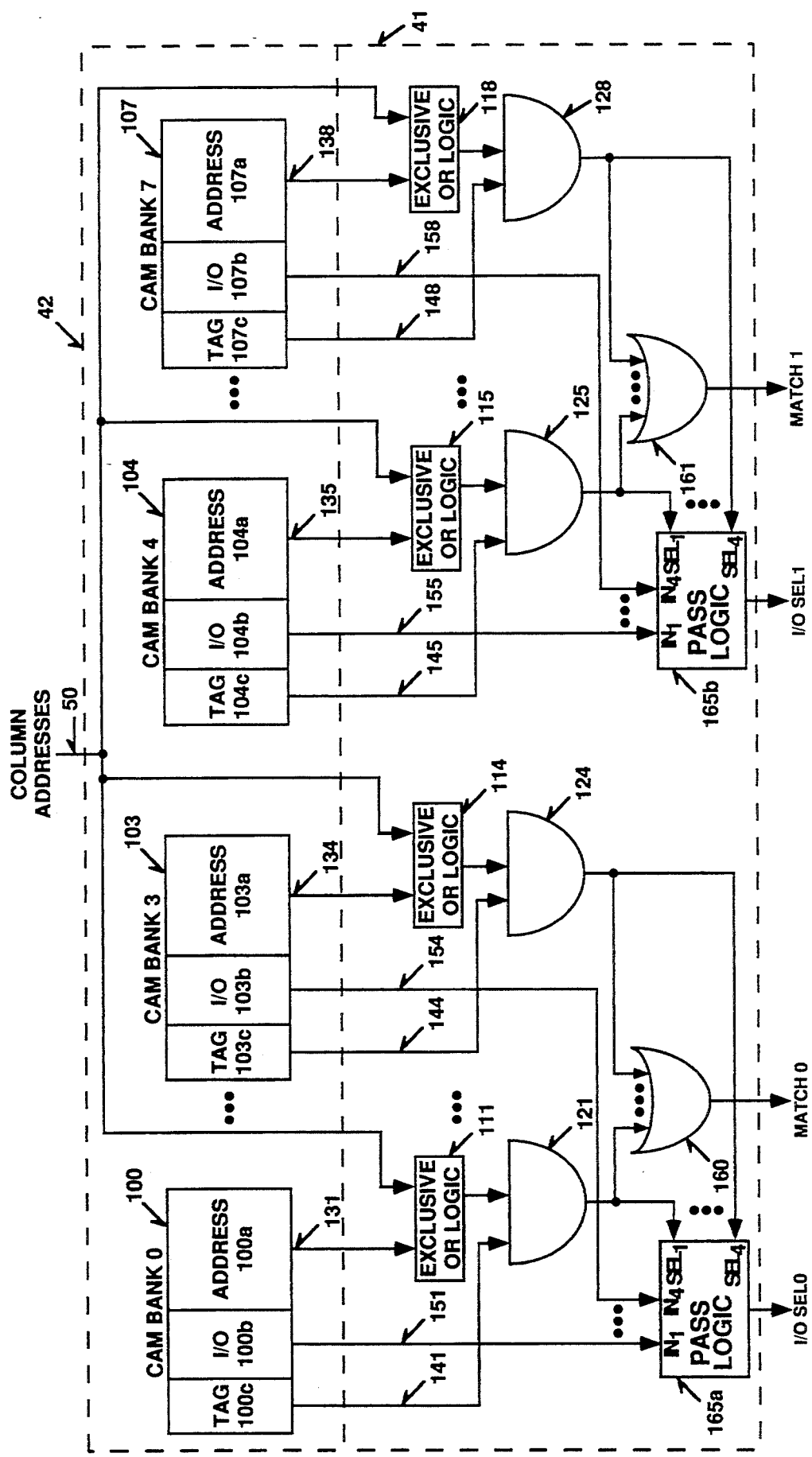
FIG. 4 is a block diagram of the CAM banks and the comparison logic of FIG. 2.

Referring to FIG. 4, CAM banks 42 include CAM banks 100 through 107. Each of CAM banks 42 includes (1) an address field that stores the column address of a word of bit lines in main memory array 21 that include a defective column, (2) an I/O field that stores I/O select data which indicates the bit position of the defective column in the addressed word of bit lines, and (3) a tag field that stores information on whether the CAM bank is used to activate one of its associative redundant column or not. For example, CAM bank 0 (i.e., 100) includes address field 100a, I/O field 100b, and tag field 100c. The address field of each of CAM banks 100–107 is coupled to its respective exclusive OR logic of comparison circuit 41. Comparison circuit 41 includes exclusive OR logic 111 through 118, AND gates 121 through 128, and pass logic 165a and 165b. For one embodiment, pass logic 165a outputs an I/O SEL0 signal and pass logic 165b outputs an I/O SEL1 signal.

Incoming column addresses are applied to each of exclusive OR logic 111–118 via bus 50 to compare with the one stored in the address field of each of CAM banks 100–107. The output of each of exclusive OR logic 111–118 is then applied to its respective one of AND gates 121–128. The other input of each of AND gates 121–128 is from the tag field of its respective CAM bank. For one embodiment, the I/O data stored in the I/O field of each of CAM banks 0–3 is applied to pass logic 165a and the I/O data stored in the I/O field of each of CAM banks 4–7 is applied to pass logic 165b. Pass logic 165a receives the output from each of AND gates 121–124 as the I/O select signal. Pass logic 165b receives the output from each of AND gates 125–128 as the I/O select signal. The output of each of AND gates 121–124 controls whether the I/O data stored in its respective CAM bank can pass through pass logic 165a to become the I/O SEL0 signal. The output of each of AND gates 125–128 controls whether the I/O data stored in its respective CAM bank can pass through pass logic 165b to become the I/O SEL1 signal. For example, when the output of AND gate 121 is logically high, the I/O data stored in I/O field 100b becomes the I/O SEL0 signal. When the output of AND gate 124 is logically high, the I/O data stored in I/O field 103b becomes the I/O SEL0 signal. The I/O data stored in the I/O field of a CAM bank indicates the bit position of the defective column in the addressed bit lines.

The output of each of AND gates 121-124 is coupled to an OR gate 160 to generate the MATCH0 signal. The output of each of AND gates 125-128 are applied to an OR gate 161 to generate the MATCH1 signal. The MATCH0 and MATCH1 signals, as well as the I/O SEL0 and I/O SEL1 signals, are applied to multiplexer logic 60. The MATCH0 signal is used to cause one of the multiplexers of multiplexer logic 60 to select the output RSA0 of redundant sense amplifier 46 (FIG. 2). The MATCH1 signal is used to cause one of the multiplexers of multiplexer logic 60 to select the output RSA1 of redundant sense amplifier 47 (FIG. 2). The MATCH0 and MATCH1 signals will be described in more detail below, in conjunction with FIG. 5.

FIG. 5 shows the circuit of multiplexer logic 60 that includes a match control logic 180 and a I/O select control logic 181. Match control logic 180 receives the MATCH0 and MATCH1 signals. Match control logic 180 also receives the MLS0 and ODD/EVEN signals. I/O select control logic 181 receives the I/O SEL0 and I/O SEL1 signals, in addition to the MLS0 and ODD-/EVEN signals. Match control logic 180 generates an N_MATCH0 signal and an N_MATCH1 signal. I/O select control logic 181 generates an N_I/O SEL0 signal and an N_I/O SEL1 signal. Each of logic 180 and logic 181 can be implemented using known logic gate circuits. FIG. 6 shows the truth table of their input signals with respect to their output signals.

Moreover, logic 60 includes multiplexers 170 through 185, each being applied with the output of one of sense amplifiers 25a-25p. For example, multiplexer 170 is applied with the output SA0 of sense amplifier 25a and multiplexer 185 is applied with the output SA15 of sense amplifier 25p. Each of multiplexers of multiplexers 170 through 185 also receives the output RSA0 from redundant sense amplifier 46 and the output RSA1 from redundant sense amplifier 47. Each of multiplexers 170-185 is controlled by the N_MATCH0 signal, the N_MATCH1 signal, and the N_I/O SEL0 and N_I/O SEL1 signals.

The N_MATCH0 signal is used to control one of multiplexers 170-185 to apply the RSA0 signal to its output. The N_MATCH1 signal is used to control one of multiplexers 170-185 to apply the RSA1 signal to its output. The N_I/O SEL0 signal is used to identify to which of multiplexers 170-185 the N_MATCH0 signal is applied. The N_I/O SEL1 signal is used to identify to which of multiplexers 170-185 the N_MATCH1 signal.

The MLS0 and ODD/EVEN signals control match control logic 180 to generate the N_MATCH0 and N_MATCH1 signals in accordance with the MATCH0 and MATCH1 signals. When the MLS0 signal indicates that flash EPROM 20 is a single-bit state flash EPROM 20, the ODD/EVEN signal is blocked and match control logic 180 simply passes the MATCH0 signal to become the N_MATCH0 signal and the MATCH1 signal to become the N_MATCH1 signal. When the MLS0 signal indicates that flash EPROM 20 is a two-bit state EPROM, the MLS0 signal controls logic 180 to generate the N_MATCH0 and N_MATCH1 signals in accordance with the ODD-/EVEN signal and the MATCH0 and MATCH1 signals.

Likewise, the MLS0 and ODD/EVEN signals control I/O select control logic 181 to generate the N_I/O SEL0 and N_I/O SEL1 signals in accordance with the I/O SEL0 and I/O SEL1 signals. When the MLS0 signal indicates that flash EPROM 20 is a single-bit state flash EPROM, the ODD/EVEN signal is blocked and control logic 181 passes the I/O SEL0 signal to become the N_I/O SEL0 signal and the I/O SEL1 signal to become the N_I/O SEL1 signal. When the MLS0 signal indicates that flash EPROM 20 is configured as a two-bit state flash EPROM, the MLS0 signal then controls logic 181 to generate the N_I/O SEL0 and N_I/O SEL1 signals in accordance with the ODD-/EVEN signal and the I/O SEL0 and I/O SEL1 signals. The relationship among these control signals are shown in the truth table of FIG. 6, which will be described in more detail below.

Referring to FIGS. 2-6, when flash EPROM 20 is configured as a single-bit state flash EPROM, each of the selected columns from a selected block of the main memory array 21 for a column address is coupled to one of sense amplifiers 25a-25p via the respective one of multiplexers 24a-24p. The MLS0 signal controls multiplexers 24a-24p to connect each of bit lines 27a-27p to one of sense amplifiers 25a-25p. Meanwhile, the MLS0 signal causes logic 180 to pass the MATCH0 and MATCH1 signals to become the N_MATCH0 and N_MATCH1 signals, respectively (see FIG. 6). The MLS0 signal also causes logic 181 to pass the I/O SEL0 and I/O SEL1 signals to become the N_I/O SEL0 and N_I/O SEL1 signals, respectively.

If the selected columns do not include any defective column, the MATCH0 and MATCH1 signals are both deasserted, which cause both of the N_MATCH0 and N_MATCH1 signals to be deasserted. The N_MATCH0 and N_MATCH1 signals then cause multiplexer logic 60 to connect the output of each of sense amplifiers 25a-25p to one of the data pins $D_0$ through $D_{15}$ via output buffers 61 (see FIG. 6).

If, however, one of the selected columns in a selected block of main memory array 21 for a column address is found defective, a redundant column from the corresponding redundant block of redundant memory 40 is selected by one of CAM banks 100-107 to replace the defective column. For example, assuming the selected column coupled to bit line 27a from a selected block of memory array 21 is found defective, CAM bank 103 may be used to store the information of the defective column. Redundant decoder 43, however, still selects two redundant columns in the corresponding redundant block to connect to redundant bit lines 53a and 53b, respectively, when the defective column is addressed. The MLS0 signal then causes multiplexer 44 to connect redundant bit line 53a to redundant sense amplifier 46 and multiplexer 45 to connect redundant bit line 53b to redundant sense amplifier 47. The MATCH0 signal is asserted and the N_MATCH0 signal is equal to the MATCH0 signal. The I/O data from I/0 field 103b of CAM bank 103 passes through pass logic 165a to become the I/O SEL0 signal. Because the defective column is coupled to bit line 27a, the I/O SEL0 signal becomes the N_I/O SEL0 signal that causes multiplexer 170 to respond to the N_MATCH0 signal. This causes multiplexer 170 to output the RSA0 signal from redundant sense amplifier 46 to the D0 data pin (see FIG. 6).

If, for example, CAM bank 104 is used to store the address of the defective column, then the MATCH1 signal is asserted. Because the N_MATCH1 signal is equal to the MATCH1 signal and the N_I/O SEL1 signal is equal to the I/O SEL1 signal, the N_MATCH1 and N_I/O SEL1 signals cause multiplexer 170 to connect the RSA1 output of redundant sense amplifier 47 to the $D_0$ data pin (see FIG. 6).

As can be seen from FIG. 6, the redundancy operation remains substantially the same if the defective column is coupled to, for example, bit line 27b. When this occurs, the output of the defective column can be replaced using one of CAM banks 100–107 (see FIG. 6).

As can be seen from FIG. 6, when two of the selected columns are found defective, two redundant columns are used to replace the defective columns and the output of each of redundant sense amplifiers 46 and 47 is used to replace the output of each of the sense amplifiers that are coupled to the defective columns. For example, when both bit lines 27a and 27b are connected to defective columns and CAM banks 103 and 104 are used to store the address of the defective columns, both the MATCH0 and MATCH1 signals are asserted when the defective columns are addressed. The I/O SEL0 and I/O SEL1 signals from CAM banks 103 and 104 are also asserted. Which of multiplexers 170 and 171 applies the RSA0 signal to its output depends on the I/O SEL0 and I/0 SEL1 signals. If the I/O SEL0 signal indicates that multiplexer 170 should be enabled by the MATCH0 signal and the I/O SEL1 signal indicates that multiplexer 171 should be enabled by the MATCH1 signal, then multiplexer 170 applies the RSA0 signal to its output and multiplexer 171 applies the RSA 1 signal to its output. If the I/O SEL1 signal indicates that multiplexer 170 should be enabled by the MATCH1 signal and the I/O SEL0 signal indicates that multiplexer 170 should be enabled by the MATCH0 signal, then multiplexer 170 applies the RSA1 signal to its output and multiplexer 171 applies the RSA0 signal to its output (see FIG. 6).

When flash EPROM 20 is configured as a two-bit state flash EPROM, each of the selected columns from a selected block of memory array 21 for a column address is also connected to one of bit lines 27a–27p. An extra address bit is applied to multiplexers 24a–24p as the ODD/EVEN signal and the MLS0 signal does not block the ODD/EVEN signal. Multiplexers 24a–24p act in pairs when the MLS0 signal does not block the ODD/EVEN signal (i.e., when flash EPROM 20 is configured as a two-bit state flash EPROM) and the ODD/EVEN signal controls each pair of multiplexers 24a–24p to connect either the even bit lines or the odd bit lines of bit lines 27a–27p to their respective sense amplifiers 25a–25p. For example, when the ODD/EVEN signal indicates that the even bit lines are selected, multiplexers 24a and 24b couple bit line 27a to sense amplifiers 25a and 25b and multiplexers 24o and 24p connect bit line 27o to sense amplifiers 25o and 25p. When the ODD/EVEN signal indicates that the odd bit lines are selected, multiplexers 24a and 24b couple bit line 27b to sense amplifiers 25a and 25b and multiplexers 24o and 24p couple bit line 27o to sense amplifiers 25o and 25p.

When the selected columns do not include any defective column, the MATCH0 and MATCH1 signals are not asserted (i.e., logical zero in the table of FIG. 6) and each of multiplexers 170–185 of multiplexer logic 60 connects the output of its respective one of sense amplifiers 25a–25p to the respective one of data pins $D_0$–$D_{15}$.

If, for example, the selected column coupled to odd bit line 27b is found defective and CAM bank 104 is used to store the address of the defective column, then the MATCH1 signal is asserted and the I/O SEL1 signal for multiplexer 171 is asserted. As described, when flash EPROM 20 is configured as a two-bit state flash EPROM, CAM banks 100–103 are used for replacing the defective columns that are coupled to the even bit lines of bit lines 27a–27p and CAM banks 104–107 are used for replacing the defective columns that are coupled to the odd bit lines of bit lines 27a–27p.

As can be seen from FIGS. 2–3, redundant column decoder 43 selects two redundant columns to connect to redundant bit lines 53a and 53b, respectively, no matter whether the selected columns of main memory array 21 by a column address include defective columns or not. When flash EPROM 20 is configured as a two-bit state flash EPROM, the redundant column coupled to redundant bit line 53a can only be used to replace a defective column coupled to one of the even bit lines of bit lines 27a–27p and the redundant column coupled to redundant bit line 53b can only be used to replace a defective column coupled to one of the odd bit lines of bit lines 27a–27p.

If the selected column coupled to bit line 27b is found defective and the ODD/EVEN signal indicates that the even bit lines of bit lines 27a–27p are selected, bit line 27b is not connected to sense amplifiers 25a and 25b and redundant bit line 53b is not connected to redundant sense amplifiers 46 and 47. When this occurs, no replacement is needed. The N_MATCH0 and N_MATCH1 signals are both deasserted by logic 180 and multiplexers 170 and 171 connect the outputs of sense amplifiers 25a and 25b to their respective data pins $D_0$ and $D_1$ as the selected column coupled to bit lines 27a is not defective (see FIG. 6).

When the ODD/EVEN signal indicates that the odd bit lines of bit lines 27a–27p are now selected, bit line 27b is then selected to connect to sense amplifiers 25a and 25b. When this happens, the ODD/EVEN signal also control multiplexers 44 and 45 to connect redundant bit line 53b to redundant sense amplifiers 46 and 47. When this occurs, the MATCH1 signal is asserted and the I/O SEL1 signal for multiplexer 171 is asserted. The ODD/EVEN signal causes logic 180 to assert N_MATCH0 and N_MATCH1 signals. In addition, the ODD/EVEN signal causes logic 181 to assert the N_I/O SEL0 signal for multiplexer 170 and the N_I/O SEL1 signal for multiplexer 171. This causes multiplexer 170 to select the RSA0 signal to the data pin $D_0$ and multiplexer 171 to select the RSA1 signal to the data pin $D_1$ (see FIG. 6).

As can be seen from FIG. 6, the redundancy operation is substantially the same when a column coupled to one of even bit lines 27a–27p is found defective and is replaced with a redundant column.

When, for example, both bit lines 27a and 27b are coupled to defective columns, each of redundant bit lines 53a and 53b is also coupled to a corresponding redundant column. When this occurs, the outputs of sense amplifiers 25a and 25b need to be replaced regardless of the ODD/EVEN signal. Logic 180 causes both of N_MATCH0 and N_MATCH1 signals to be asserted, depending on the ODD/EVEN signal. Logic 181 causes the N_I/O SEL0 signal for multiplexer 170 to be asserted and the N_I/O SEL1 signal for multiplexer 171 to be asserted. Multiplexer 170 then connects the RSA0 signal from redundant sense amplifier 46 to the $D_0$ pin and multiplexer 171 then connects the RSA1 signal from redundant sense amplifier 47 to the $D_1$ pin.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A memory having a first output and a second output, comprising:
    (A) a main array having a first column and a second column;
    (B) a redundant array having a first redundant column and a second redundant column;
    (C) a logic having (1) a first content addressable memory (CAM) set for activating the first redundant column to replace the first column when the first column is defective and (2) a second CAM set for activating the second redundant column to replace the second column when the second column is defective;
    (D) a configuration circuit for controlling the logic to selectively couple the first and second columns and the first and second redundant columns to the first and second outputs, wherein when the configuration circuit is in a first state, the configuration circuit causes the logic to couple the first redundant column to the first output if the first column is defective and the second redundant column to the second output if the second column is defective, wherein when the configuration circuit is in a second state, the configuration circuit causes the logic to couple (1) the first redundant column to the first and second outputs when the first column is defective and addressed, (2) the second column to the first and second outputs when the second column is addressed and the first column is defective, or (3) the second redundant column to the first and second outputs when the second column is addressed and defective.

2. The memory of claim 1, wherein the logic further comprises
    (i) a comparison circuit coupled to the first and second CAM sets for comparing an address with first and second addresses stored in the first and second CAM sets, wherein the first and second addresses are stored in the first and second CAM sets when the first and second columns are defective;
    (ii) an output multiplexer logic coupled to (1) the first and second columns, (2) the first and second redundant columns, (3) the comparison circuit, and (4) the configuration circuit for selectively coupling the first and second columns and the first and second redundant columns to the first and second outputs under control of the comparison circuit and the configuration circuit.

3. The memory of claim 2, further comprising
    (a) a first sense amplifier and a second sense amplifier coupled to the first and second outputs;
    (b) a first multiplexer coupled to the first and second columns and the first sense amplifier for selectively coupling the first and second columns to the first sense amplifier under control of the configuration circuit;
    (c) a second multiplexer coupled to the first and second columns and the second sense amplifier for selectively coupling the first and second columns to the second sense amplifier under control of the configuration circuit.

4. The memory of claim 3, further comprising a select logic coupled to a first reference voltage and a second reference voltage for selectively applying the first and second reference voltages to the first and second sense amplifiers under control of the configuration circuit, wherein when the configuration circuit is in the second state, the select logic couples the first and second reference voltages to the first and second sense amplifiers.

5. The memory of claim 4, further comprising
    (d) a first redundant sense amplifier and a second redundant sense amplifier coupled to the first and second outputs;
    (e) a first redundant multiplexer coupled to the first and second redundant columns and the first redundant sense amplifier for selectively coupling the first and second redundant columns to the first redundant sense amplifier under control of the configuration circuit;
    (f) a second redundant multiplexer coupled to the first and second redundant columns and the second redundant sense amplifier for selectively coupling the first and second redundant columns to the second redundant sense amplifier under control of the configuration circuit.

6. The memory of claim 5, wherein the select logic also applies the first and second reference voltages to the first and second redundant sense amplifiers when the configuration circuit is in the second state.

7. The memory of claim 6, wherein the configuration circuit further comprises a configuration cell.

8. The memory of claim 1, wherein the memory is an electrically erasable and programmable memory.

9. A nonvolatile memory having a first output and a second output, comprising:
    (A) a main array having a first column and a second column;
    (B) a redundant array having a first redundant column and a second redundant column;
    (C) a first CAM (content addressable memory) set for activating the first redundant column by storing a first address to replace the first column when the first column is defective and a second CAM set for activating the second redundant column by storing a second address to replace the second column when the second column is defective;
    (D) a comparison circuit coupled to the first and second CAM sets for comparing an address with the first and second addresses stored in the respective first and second CAM sets, wherein the comparison circuit activates the first redundant column when the address matches the first address, wherein the comparison circuit activates the second redundant column when the address matches the second address;
    (E) an output logic coupled to (1) the first and second columns, (2) the first and second redundant columns, and (3) the comparison circuit for selectively coupling the first and second columns and the first and second redundant columns to the first and second outputs under control of the comparison circuit;

(F) a configuration circuit for controlling the output logic to selectively couple the first and second columns and the first and second redundant columns to the first and second outputs, wherein when the configuration circuit is in a first state, the configuration circuit causes the output logic to couple the first redundant column to the first output if the first column is defective and addressed and the second redundant column to the second output if the second column is defective and addressed, wherein when the configuration circuit is in a second state, the configuration circuit causes the output logic to couple (1) the first redundant column to the first and second outputs when the first column is defective and addressed, (2) the second column to the first and second outputs when the second column is addressed and the first column is defective, or (3) the second redundant column to the first and second outputs when the second column is addressed and defective.

10. The memory of claim 9, further comprising
(a) a first sense amplifier and a second sense amplifier coupled to the first and second outputs;
(b) a first multiplexer coupled to the first and second columns and the first sense amplifier for selectively coupling the first and second columns to the first sense amplifier under control of the configuration circuit;
(c) a second multiplexer coupled to the first and second columns and the second sense amplifier for selectively coupling the first and second columns to the second sense amplifier under control of the configuration circuit.

11. The memory of claim 10, further comprising a select logic coupled to a first reference voltage and a second reference voltage for selectively applying the first and second reference voltages to the first and second sense amplifiers under control of the configuration circuit, wherein when the configuration circuit is the second state, the select logic couples the first and second reference voltages to the first and second sense amplifiers.

12. The memory of claim 11, further comprising
(d) a first redundant sense amplifier and a second redundant sense amplifier coupled to the first and second outputs;
(e) a first redundant multiplexer coupled to the first and second redundant columns and the first redundant sense amplifier for selectively coupling the first and second redundant columns to the first redundant sense amplifier under control of the configuration circuit;
(f) a second redundant multiplexer coupled to the first and second redundant columns and the second redundant sense amplifier for selectively coupling the first and second redundant columns to the second redundant sense amplifier under control of the configuration circuit.

13. The memory of claim 12, wherein the select logic also applies the first and second reference voltages to the first and second redundant sense amplifiers when the configuration circuit is in the second state.

14. The memory of claim 13, wherein the configuration circuit further comprises a configuration cell.

15. The memory of claim 9, wherein the memory is an electrically erasable and programmable memory.

* * * * *

UNITED STATES PATENT AND TRADEMARK OFFICE
CERTIFICATE OF CORRECTION

PATENT NO.   :   5,438,546

DATED        :   August 1, 1995

INVENTOR(S)  :   Ishac et al.

It is certified that error appears in the above-identified patent and that said Letters Patent is hereby corrected as shown below:

In column 11 at line 1 delete "DO data pin" and insert --$D_0$ data pin--

Signed and Sealed this

Thirty-first Day of December, 1996

Attest:

BRUCE LEHMAN

*Attesting Officer*     Commissioner of Patents and Trademarks